United States Patent
Morita

(10) Patent No.: US 10,438,892 B2
(45) Date of Patent: Oct. 8, 2019

(54) SEMICONDUCTOR DEVICE INCLUDING AN AIR GAP BETWEEN WIRINGS AND MANUFACTURING METHOD THEREOF

(71) Applicant: TOSHIBA MEMORY CORPORATION, Minato-ku (JP)

(72) Inventor: Toshiyuki Morita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/701,497

(22) Filed: Sep. 12, 2017

(65) Prior Publication Data

US 2018/0218982 A1    Aug. 2, 2018

(30) Foreign Application Priority Data

Jan. 31, 2017    (JP) .................. 2017-015889

(51) Int. Cl.
| | |
|---|---|
| H01L 23/532 | (2006.01) |
| H01L 23/522 | (2006.01) |
| H01L 21/768 | (2006.01) |
| H01L 21/764 | (2006.01) |

(52) U.S. Cl.
CPC ...... *H01L 23/53242* (2013.01); *H01L 21/764* (2013.01); *H01L 21/7682* (2013.01); *H01L 21/76802* (2013.01); *H01L 21/76877* (2013.01); *H01L 23/5222* (2013.01); *H01L 23/5226* (2013.01); *H01L 23/53209* (2013.01); *H01L 23/53257* (2013.01)

(58) Field of Classification Search
CPC ............ H01L 21/7682; H01L 23/5222; H01L 23/53295; H01L 23/5226; H01L 21/76802; H01L 21/764

USPC .............. 257/758, 774, E21.573, E21.581, 257/E23.144; 438/421

See application file for complete search history.

(56) References Cited

U.S. PATENT DOCUMENTS

| | | | |
|---|---|---|---|
| 6,451,669 B2 * | 9/2002 | Torres .................. | H01L 21/7682 257/E21.273 |
| 7,033,926 B2 * | 4/2006 | Schindler ............ | H01L 21/7682 257/E21.581 |
| 7,879,683 B2 | 2/2011 | Al-Bayati et al. | |
| 8,193,582 B2 | 6/2012 | Matsubara | |
| 8,497,543 B2 * | 7/2013 | Ogi ................... | H01L 27/11524 257/314 |

(Continued)

FOREIGN PATENT DOCUMENTS

| | | |
|---|---|---|
| JP | 2009-194286 | 8/2009 |
| JP | 2010-21295 | 1/2010 |
| JP | 5501596 | 5/2014 |

*Primary Examiner* — David Chen
(74) *Attorney, Agent, or Firm* — Oblon, McClelland, Maier & Neustadt, L.L.P.

(57) ABSTRACT

A semiconductor device according to present embodiment has first wirings provided in a first area and made of a first metal. A first gap is provided between the first wirings adjacent to each other. Second wirings or contact plugs are provided in a second area in which the first wirings are not provided. The second wirings or contact plugs are made of a second metal. A first insulation film is provided between the second wirings or contact plugs adjacent to each other. The first insulation film has second gaps. A second insulation film is provided on the first wirings, the first gap, and the second gaps.

3 Claims, 12 Drawing Sheets

(56) References Cited

U.S. PATENT DOCUMENTS

2007/0264819 A1* 11/2007 Offenberg ........... H01L 21/7682
 438/623
2009/0302475 A1 12/2009 Korogi et al.
2011/0260326 A1* 10/2011 Clevenger ......... H01L 21/02126
 257/770

* cited by examiner

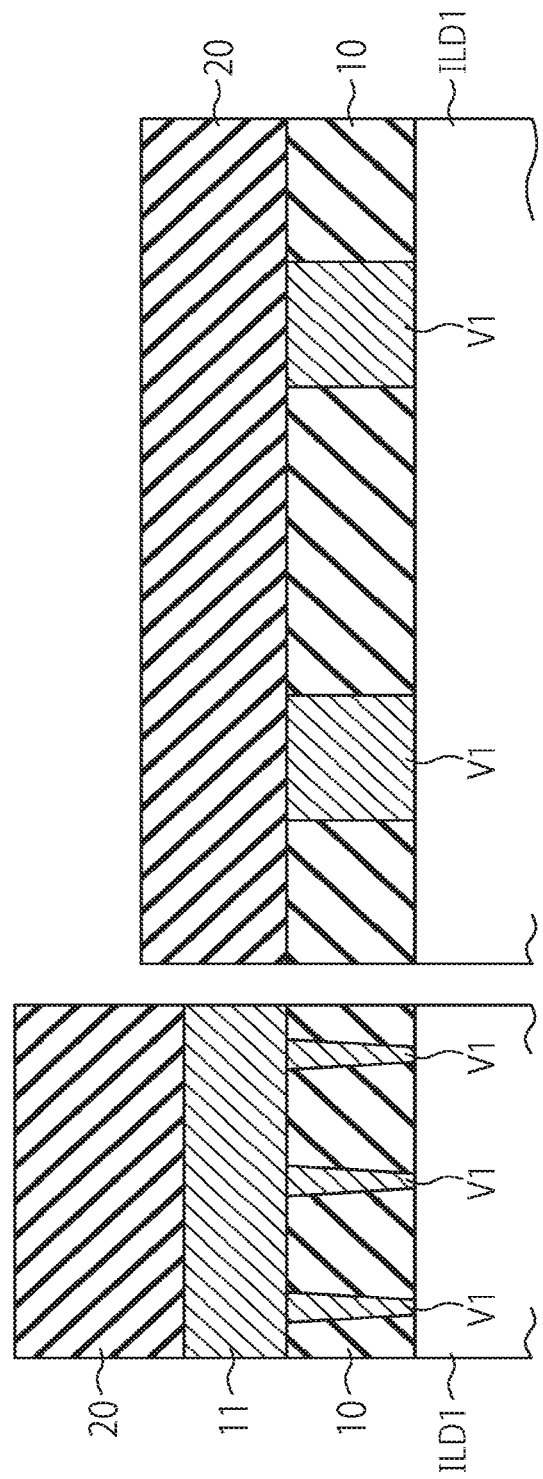

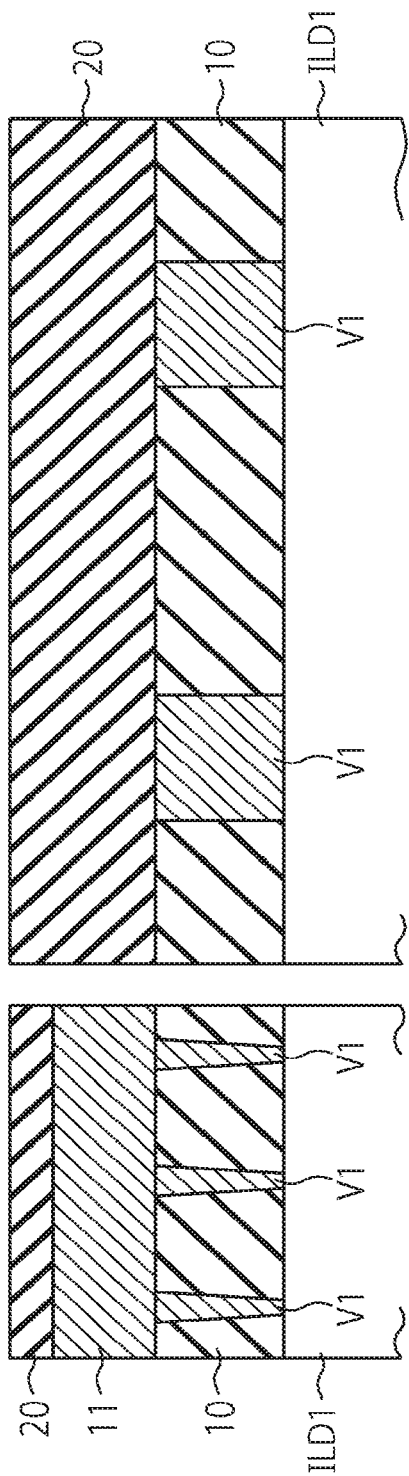

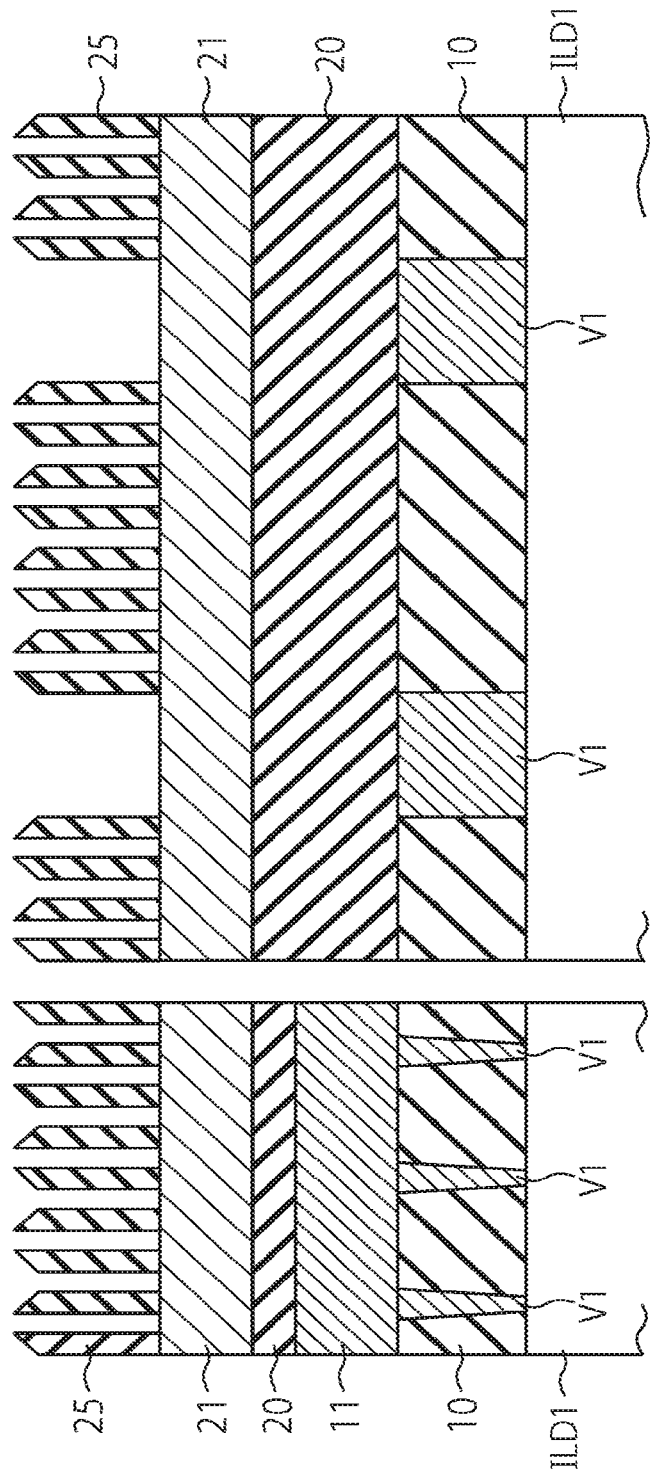

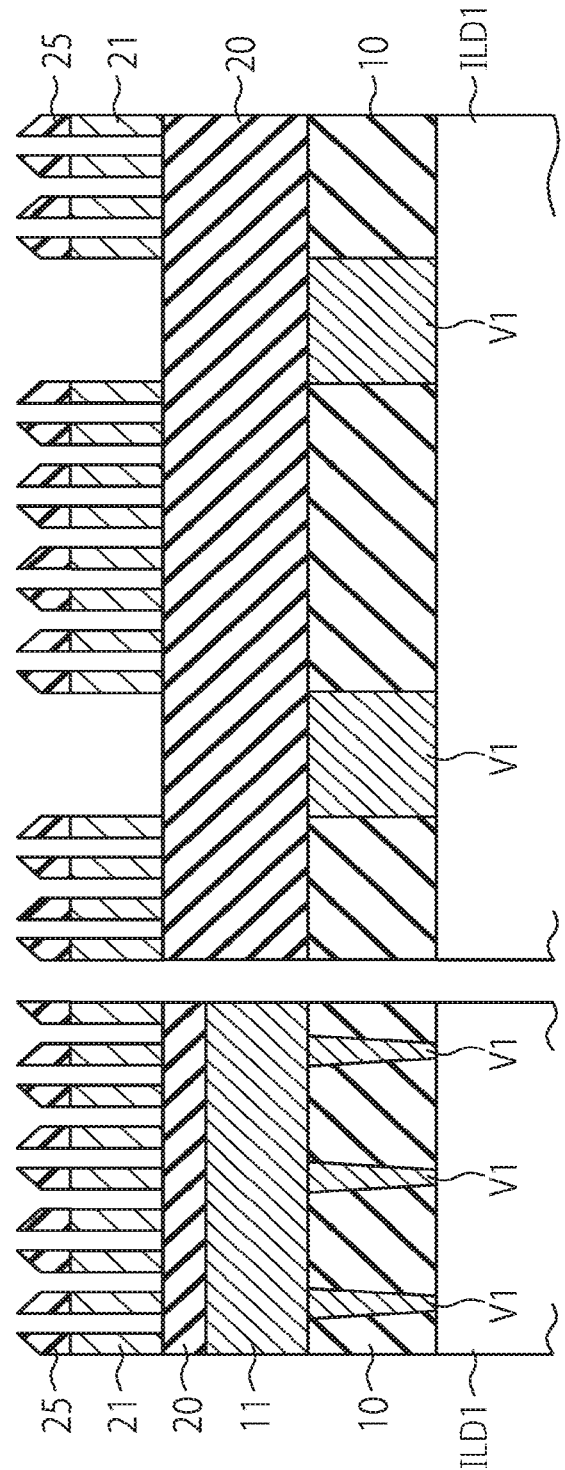

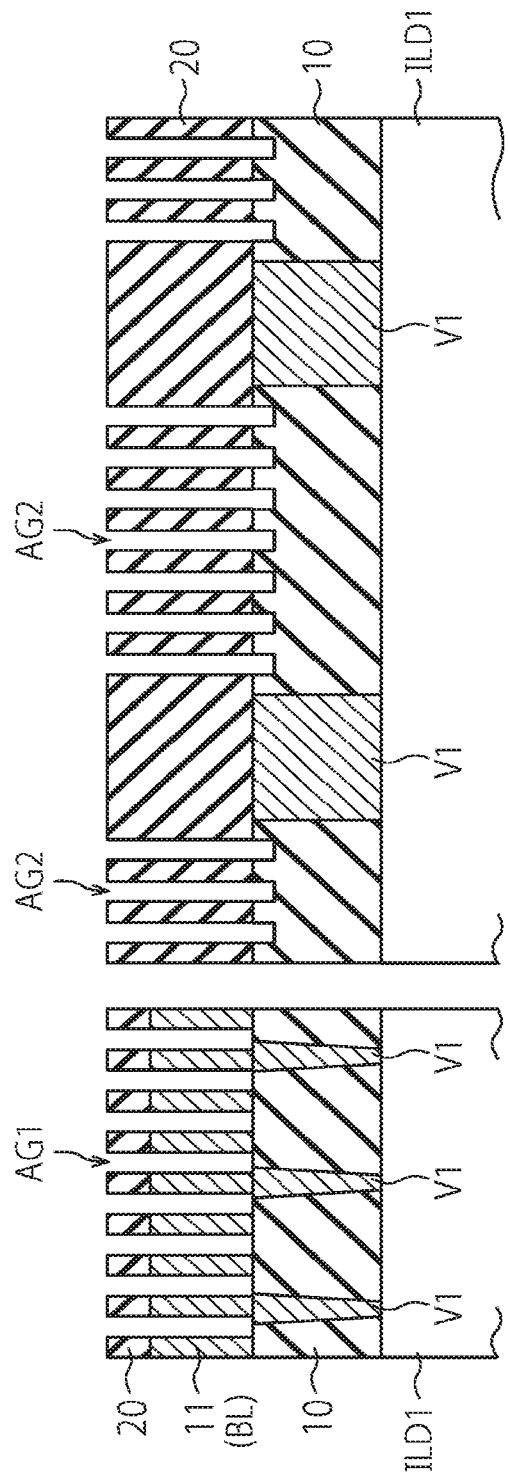

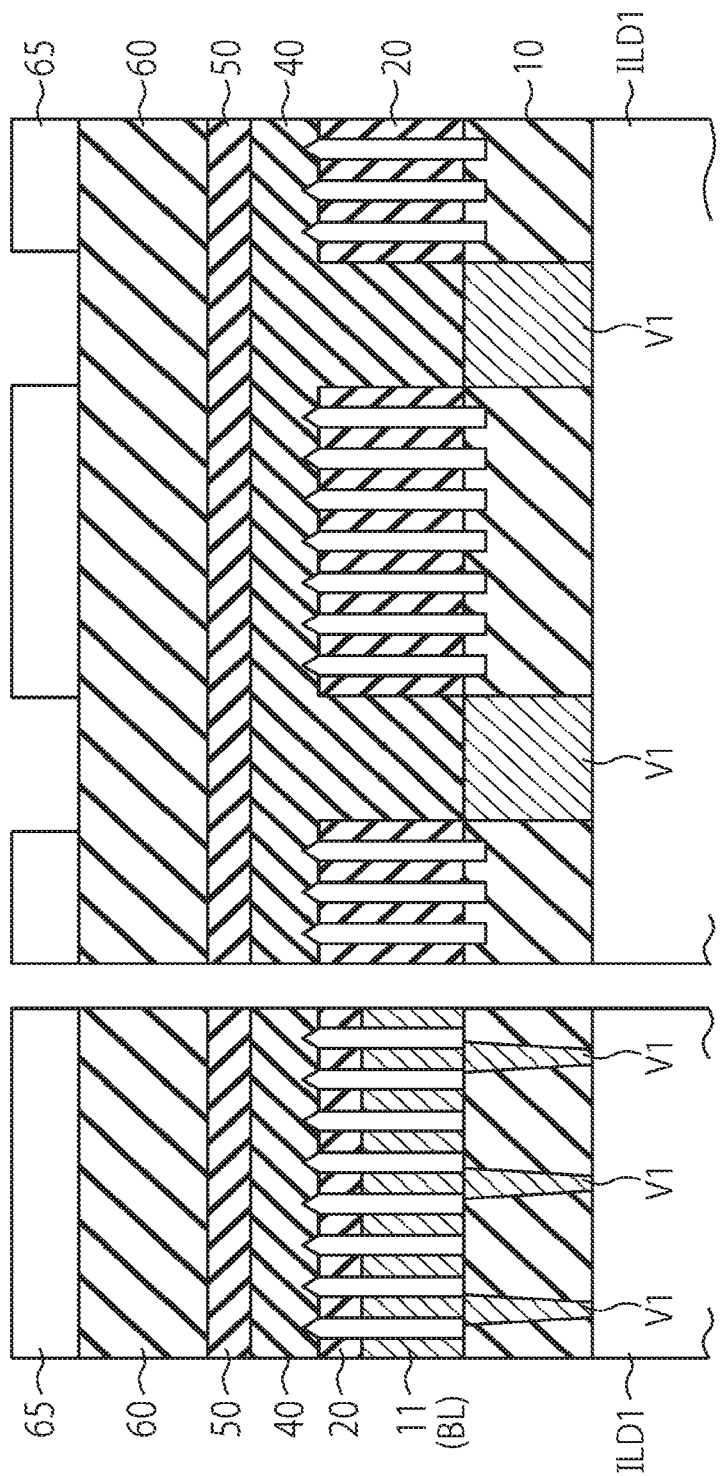

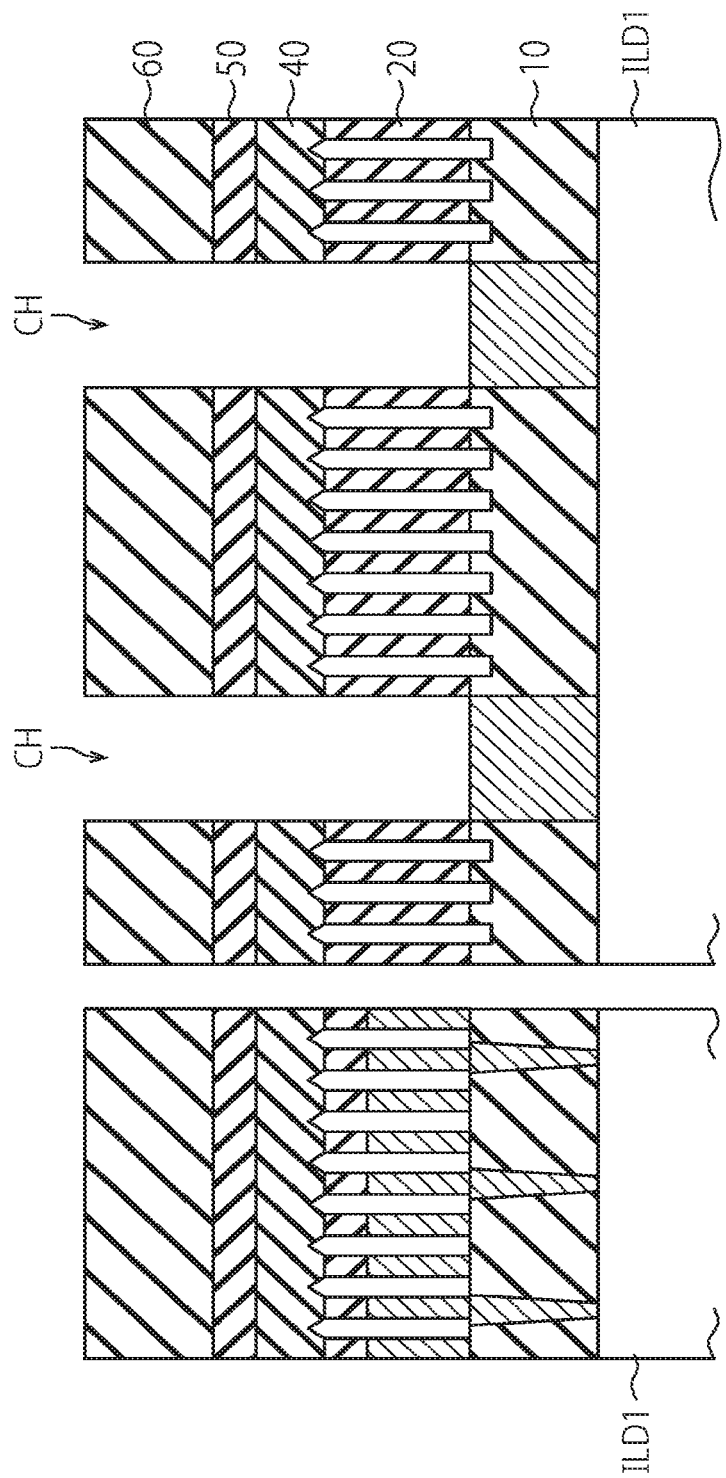

SEMICONDUCTOR DEVICE INCLUDING AN AIR GAP BETWEEN WIRINGS AND MANUFACTURING METHOD THEREOF

CROSS REFERENCE TO RELATED APPLICATIONS

This application is based upon and claims the benefit of priority from the prior Japanese Patent Application No. 2017-015889, filed on Jan. 31, 2017, the entire contents of which are incorporated herein by reference.

FIELD

Embodiments relate to a semiconductor device and manufacturing method thereof.

BACKGROUND

In a semiconductor memory, such as a NAND EEPROM (Electrically Erasable and Programmable Read-Only Memory), a proximity effect is shown in fine wirings such as bit lines. In order to restrict such a proximity effect, an air gap may be provided between wirings adjacent to each other.

However, if an interlayer insulation film provided on the air gap is thin, due to mechanical pressure in a CMP (Chemical Mechanical Policing) process or the like, cracks occur in the interlayer insulation film, starting from the air gap. Conversely, if the interlayer insulation film is thick, contact plugs, wirings, etc. are inevitably formed deep in the interlayer insulation film in a peripheral circuit area, which causes increase in parasitic capacitance between contact plugs, wirings, etc. adjacent to each other.

BRIEF DESCRIPTION OF THE DRAWINGS

FIGS. 4A and 4B are sectional views showing the memory manufacturing method, following to FIGS. 3A and 3B, respectively;

FIGS. 5A and 5B are sectional views showing the memory manufacturing method, following to FIGS. 4A and 4B, respectively;

FIGS. 8A and 8B are sectional views showing the memory manufacturing method, following to FIGS. 7A and 7B, respectively;

FIGS. 9A and 9B are sectional views showing the memory manufacturing method, following to FIGS. 8A and 8B, respectively;

FIGS. 10A and 10B are sectional views showing the memory manufacturing method, following to FIGS. 9A and 9B, respectively;

FIGS. 11A and 11B are sectional views showing the memory manufacturing method, following to FIGS. 10A and 10B; and FIGS. 12A and 12B are sectional views showing the memory manufacturing method, following to FIGS. 11A and 11B, respectively.

DETAILED DESCRIPTION

A semiconductor device according to present embodiment has first wirings provided in a first area and made of a first metal. A first gap is provided between the first wirings adjacent to each other. Second wirings or contact plugs are provided in a second area in which the first wirings are not provided. The second wirings or contact plugs are made of a second metal. A first insulation film is provided between the second wirings or contact plugs adjacent to each other. The first insulation film has second gaps. A second insulation film is provided on the first wirings, the first gap, and the second gaps.

Embodiments will now be explained with reference to the accompanying drawings, although not limited thereto. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

Figures 1A, 1B:
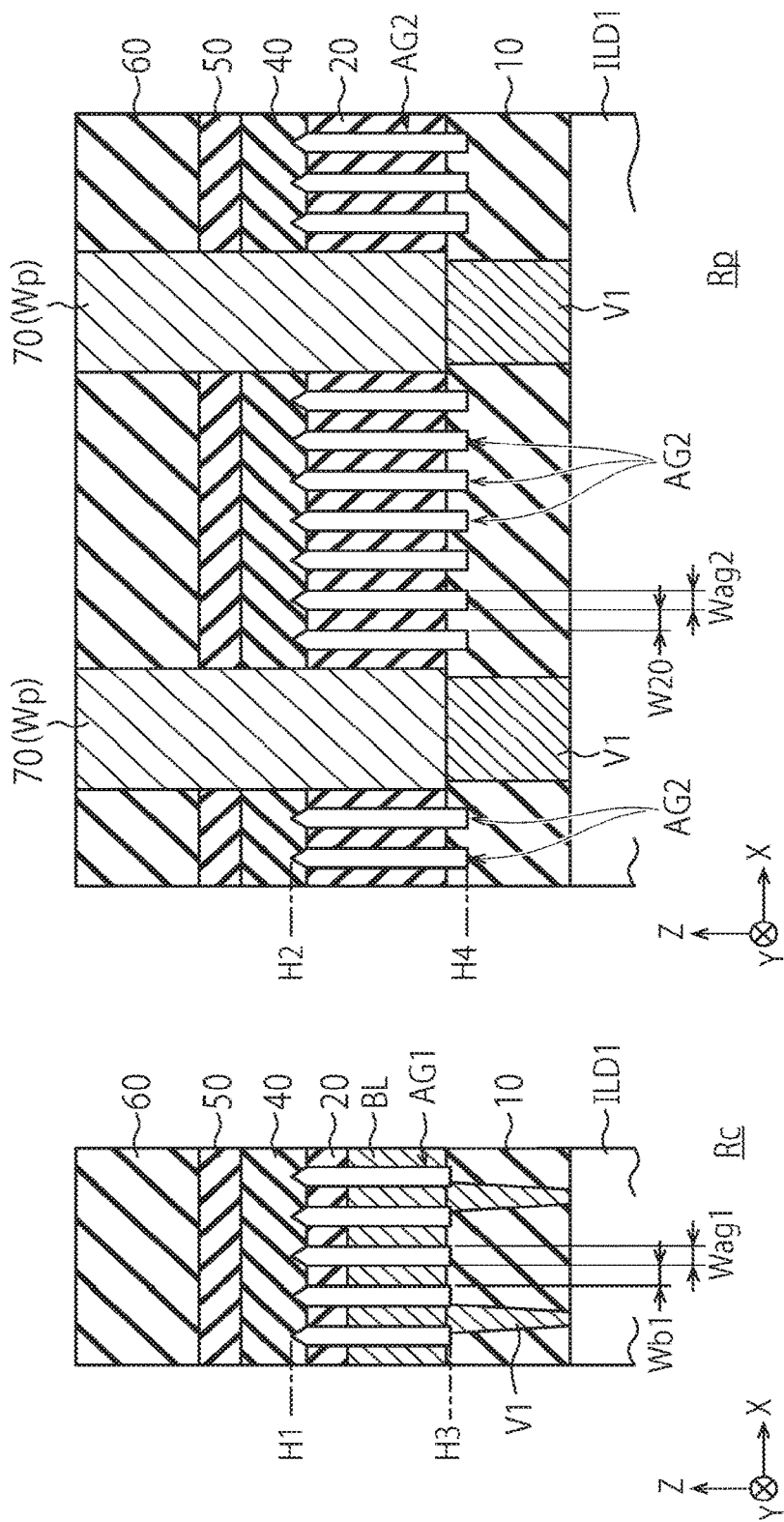
FIGS. 1A and 1B are sectional views showing an example of the configuration of a memory according to an embodiment.
Figure 2B:
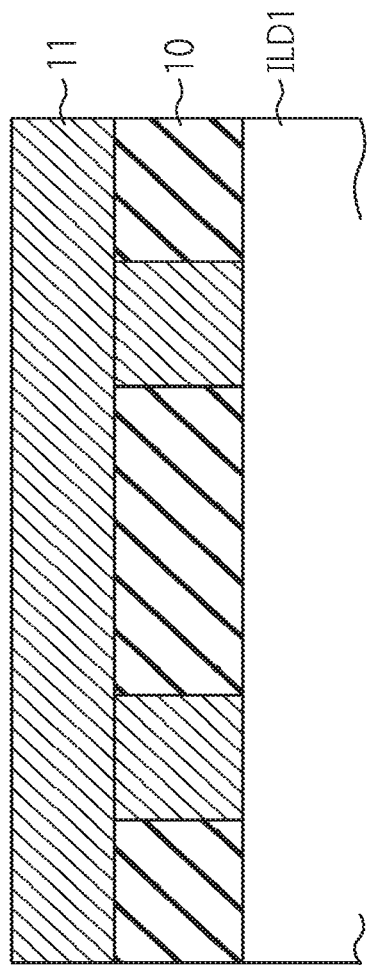
FIGS. 2A and 2B are sectional views showing an example of a memory manufacturing method according to the present embodiment.
Figure 2A:
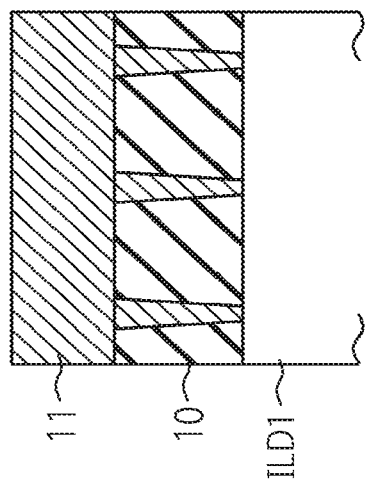

FIGS. 1A and 1B are sectional views showing an example of the configuration of a memory according to the present embodiment. The memory according to the present embodiment may be a semiconductor memory such as a NAND EEPROM. A memory cell array (not shown) of the NAND EEPROM may be a solid memory cell array of a three-dimensional arrangement or a plane memory cell array of a two-dimensional arrangement.

FIG. 1A shows a memory cell area Rc provided with a memory cell array. FIG. 1B shows a peripheral circuit area Rp provided around the memory cell array, for controlling the memory cell array. The memory cell area Rc and the peripheral circuit area Rp are areas located on the same semiconductor chip, that is, on the same substrate. A memory cell array, not shown, is provided below the configuration shown in FIG. 1A. Provided below the configuration shown in FIG. 1B are semiconductor devices (such as, a transistor, a resistor, and a capacitor) also not shown, with no memory cell arrays provided. These memory cell arrays and semiconductor devices are covered with an interlayer insulation film ILD1.

As shown in FIG. 1A, an insulation film 10 is provided on the interlayer insulation film ILD1 in the memory cell area Rc as a first area. Used for the insulation film 10 is, for example, a silicon oxide film made of TEOS (TetraEthOxySilane) or the like. Provided inside the insulation film 10 are via contacts V1, used for which is, for example, a metal such as tungsten.

Provided on the insulation film 10 or the via contacts V1 are bit lines BL or air gaps AG1. The bit lines BL, as first wirings, are arranged in a lateral direction (X-direction) with respect to the drawing sheet. Each bit lines BL is extended in a perpendicular direction (Y-direction) with respect to the drawing sheet. Used for the bit lines BL is, as a first metal, for example, any one of tungsten, molybdenum, nickel, and cobalt, or an alloy of at least two kinds of these metals. Each air gap AG1 is provided between the bit lines BL adjacent to each other.

The air gaps AG1, as first gaps, are arranged in the X-direction, in the same manner as the bit lines BL. Each air gap AG1 is extended in the Y-direction. The air gap AG1 may be filled with, for example, air, an inert gas, etc. The air gap AG1 exhibits a low relative permittivity compared to an insulation film such as a silicon oxide film. Therefore, the air gap AG1 can restrict parasitic capacitance between the bit lines BL adjacent to each other. Accordingly, it is achieved to reduce an effect of a voltage at one of the adjacent bit lines BL to the other.

An insulation film 40 is provided on the bit lines BL and the air gaps AG1. Used for the insulation film 40 is, for example, an insulation material, such as a silane (SiH4) film, of a low coverage. With this material, the insulation film 40, as a second insulation film, can cover the air gap AG1 between the adjacent bit lines BL to maintain the air gap AG1, not filling the air gap AG1.

Insulation films 50 and 60 are provided on the insulation film 40. Used for the insulation film 50 is an insulation material such as a silicon nitride film. Used for the insulation film 60 is an insulation material made of, for example, TEOS. The insulation film 50 functions as an etching stopper when contact plugs 70 are formed.

As described above, the memory according to the present embodiment has the air gap AG1 between the bit lines BL adjacent to each other. Having this configuration, capacitive coupling between the bit lines BL is restricted to reduce an effect of a voltage at one of the bit lines BL to the other.

As shown in FIG. 1B, the insulation film 10 is provided on the interlayer insulation film ILD1 in the peripheral circuit area Rp as a second area, with the via contacts V1 provided inside the insulation film 10.

The contact plugs 70 are provided on the via contacts V1 in such a manner that the contact plugs 70 are extended from the upper surface of the insulation film 60 to the bottom surface of the insulation film 10 via the insulation films 60, 50, 40, and 20 in this order. Used for the contact plugs 70 is, as a second metal, for example, any one of copper, silver, and gold, or an alloy of at least two kinds of these metals. Wirings Wp may be provided instead of the contact plugs 70. In this case, the wirings Wp, as second wirings, are provided to be extended from the upper surface of the insulation film 60 to the bottom surface of the insulation film 10, in the same manner as the contact plugs 70. The wirings Wp may be extended in the Y-direction. The material of the wirings Wp may be the same as that of the contact plugs 70. Hereinbelow, explanation will be made for the contact plugs 70, while explanation of the wirings Wp is omitted.

The insulation films 20 and 40 are provided on the insulation film 10. Air gaps AG2 are provided inside the insulation films 20 and 40 between the contact plugs 70.

The air gaps AG2, as second gaps, are arranged in the X-direction, in the same manner as the air gaps AG1. Each air gap AG2 is extended in the Y-direction. The air gap AG2 may be filled with, for example, air, an inert gas, etc. Therefore, the air gap AG2 can restrict parasitic capacitance between the contact plugs 70 adjacent to each other or between the second wirings Wp adjacent to each other. Accordingly, it is achieved to reduce an effect of a voltage at one of the adjacent contact plugs 70 to the other.

The insulation film 40 is provided on the insulation film 20 and the air gaps AG2. Used for the insulation film 40 is, for example, an insulation material, such as a silane (SiH4) film, of a low coverage. With this material, the insulation film 40, as a second insulation film, can cover the air gap AG2 between the adjacent contact plugs 70 to maintain the air gap AG2, not filling the air gap AG2. The insulation films 50 and 60 are provided on the insulation film 40.

As described above, the memory according to the present embodiment has the air gaps AG2 inside the insulation film 20 as a first insulation film between the adjacent contact plugs 70 in the peripheral circuit area Rp. Having this configuration, capacitive coupling between the adjacent contact plugs 70 is restricted to reduce an effect of a voltage at one of the contact plugs 70 to the other.

The air gaps AG2 are lower than the contact plugs 70 so that the air gaps AG2 are not provided entirely along the contact plugs 70 in the height direction (Z-direction) of the contact plugs 70. However, even if the air gaps AG2 are provided in part (lower part) of the adjacent contact plugs 70, the air gaps AG2 exhibit an effect of reducing capacitive coupling between the adjacent contact plugs 70.

The air gaps AG1 and AG2 in the memory cell area Rc and the peripheral circuit area Rp, respectively, are formed using the same side wall mask in the same etching process, as described later. Therefore, a width Wb1 of each bit line BL in a direction (X-direction) in which the bit lines BL are adjacent to each other is almost equal to a width W20 of the insulation film (first insulation film) 20 between the adjacent air gaps AG2.

Moreover, in the memory cell area Rc and the peripheral circuit area Rp, by arranging side wall masks at an almost constant interval (core material width), a width Wag1 of each air gap AG1 in the direction (X-direction) in which the bit lines BL are adjacent to each other becomes almost equal to a width Wag2 of each air gap AG2 in the direction (X-direction) in which the air gaps AG2 are adjacent to each other.

A height H2 of the upper surface of each air gap AG2 is almost equal to a height H1 of the upper surface of each air gap AG1. On the contrary, a depth H4 of the bottom surface of each air gap AG2 is deeper than a depth H3 of the bottom surface of each air gap AG1. This is because the first metal of the bit lines BL and the insulation film 20 are processed in the same etching process. There is no particular limitation on the number of the air gaps AG1 and AG2. For example, a more number of air gaps AG2 may be provided between the contact plugs 70 adjacent to each other.

Subsequently, a memory manufacturing method according to the present embodiment will be explained.

FIGS. 2A to 12B are sectional views showing an example of the memory manufacturing method according to the present embodiment. The drawing A in each of FIGS. 2 to 12 shows a section of the memory cell area Rc. The drawing B in each of FIGS. 2 to 12 shows a section of the peripheral circuit area Rp. FIGS. 2A to 12B are shown for convenience, not necessarily be identical with FIGS. 1A and 1B, respectively.

First of all, a memory cell array is formed in the memory cell area Rc of a semiconductor substrate (not shown) and semiconductor devices of peripheral circuits are formed in the peripheral circuit area Rp of the semiconductor substrate. Subsequently, the interlayer insulation film ILD1 is formed on the memory cell array and on the peripheral circuits. Subsequently, the insulation film 10 is formed on the interlayer insulation film ILD1 using a CVD (Chemical Vapor Deposition) method.

Subsequently, using an RIE (Reactive Ion Etching) method, contact holes to be used for the via contacts V1 are formed in the insulation film 10. A thin film of titanium (not shown) or the like as a barrier metal is formed in each contact hole. Thereafter, a first metal film 11 of tungsten or the like is formed by sputtering or the like on the insulation film 10 as a foundation layer and in the via contacts V1. What is obtained in this way is the configuration shown in FIGS. 2A and 2B.

Figure 3A:
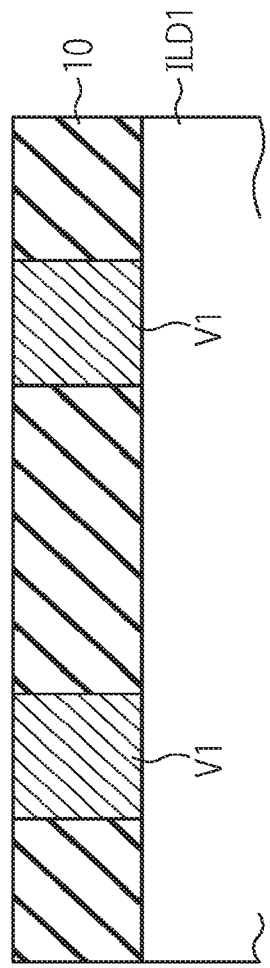
FIGS. 3A and 3B are sectional views showing the memory manufacturing method, following to FIGS. 2A and 2B, respectively.
Figure 3B:
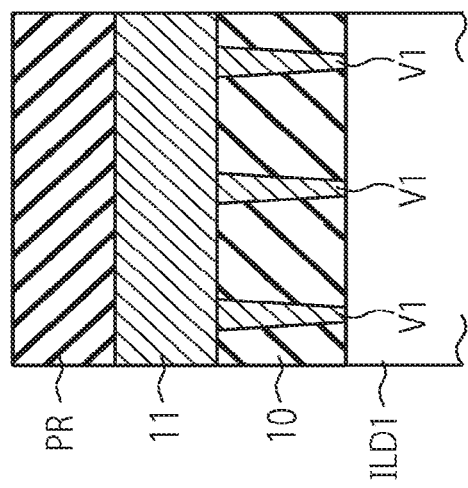

Subsequently, as shown in FIGS. 3A and 3B, using a lithography method and an RIE method, the first metal film 11 in the memory cell area Rc is covered with a photoresist PR. Thereafter, the first metal film 11 in the peripheral circuit area Rp is etched to form the via contacts V1 in the peripheral circuit area Rp. In this way, the via contacts V1 are formed in the peripheral circuit area Rp while the first metal film 11 remains in the memory cell area Rc. Later, the first metal film 11 in the memory cell area Rc becomes the bit lines BL and the via contacts V1.

Subsequently, as shown in FIGS. 4A and 4B, using a CVD method, a silicon oxide film 20 as the first insulation film is deposited on the metal film 11 in the memory cell area Rc and on the insulation film 10 in the peripheral circuit area Rp. The silicon oxide film 20 is, for example, a silane film.

The silicon oxide film 20 is formed to have a film thickness thicker than the film thickness of the first metal film 11. For example, the film thickness of the first metal film 11 is about 80 nm whereas the film thickness of the silicon oxide film 20 is about 100 nm. Accordingly, in the succeeding CPM process, the silicon oxide film 20 can be flattened by being polished.

Subsequently, as shown in FIGS. 5A and 5B, the silicon oxide film 20 is flattened using a CMP method, having the first metal film 11 in the memory cell area Rc being not exposed. In the memory cell area Rc, the first metal film 11 and the silicon oxide film 20 are formed on the insulation film 10 and the via contacts V1. In the peripheral circuit area Rp, the silicon oxide film 20 is formed on the insulation film 10 and the via contacts V1.

Figure 6A:
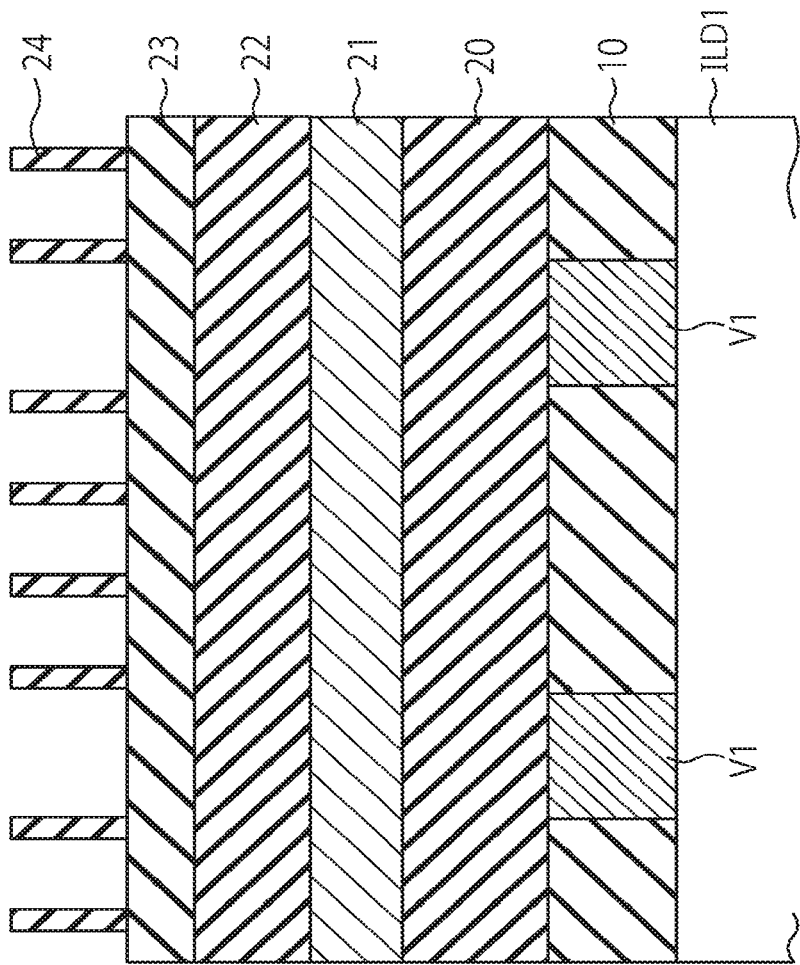
FIGS. 6A and 6B are sectional views showing the memory manufacturing method, following to FIGS. 5A and 5B, respectively.
Figure 6B:
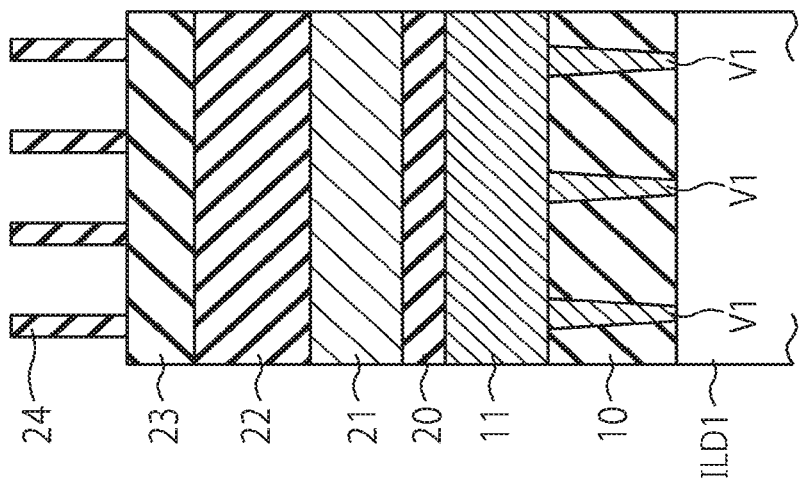

Subsequently, as shown in FIGS. 6A and 6B, using a CVD method or an ALD (Atomic Layer Deposition) method, an amorphous silicon layer 21 as a mask material, a resist layer 22 as a core material, and a silicon oxide film 23 as a hard mask are deposited on the silicon oxide film 20 in this order.

Subsequently, using a lithography method, a photoresist 24 is applied over the silicon oxide film 23 and is then patterned. In this way, the photoresist 24 is processed into a layout pattern of a core material for forming a side wall to be used in a side wall transfer method. What is obtained in this way is the configuration shown in FIGS. 6A and 6B.

Subsequently, the silicon oxide film 23 and the resist layer 22 are processed using the photoresist 24 as a mask. In this way, the pattern of the photoresist 24 is transferred to the silicon oxide film 23 and the resist layer 22. In this transfer, the silicon oxide film 23 functions as a hard mask, with the resist layer 22 remaining as a core material. Hereinafter, the resist layer 22 is also referred to as a core material 22. In the peripheral circuit area Rp, since the air gaps AG2 are not formed over the place where the contact plugs 70 are formed (that is, over the via contacts V1), it is not required to form the core material 22.

Figure 7A:
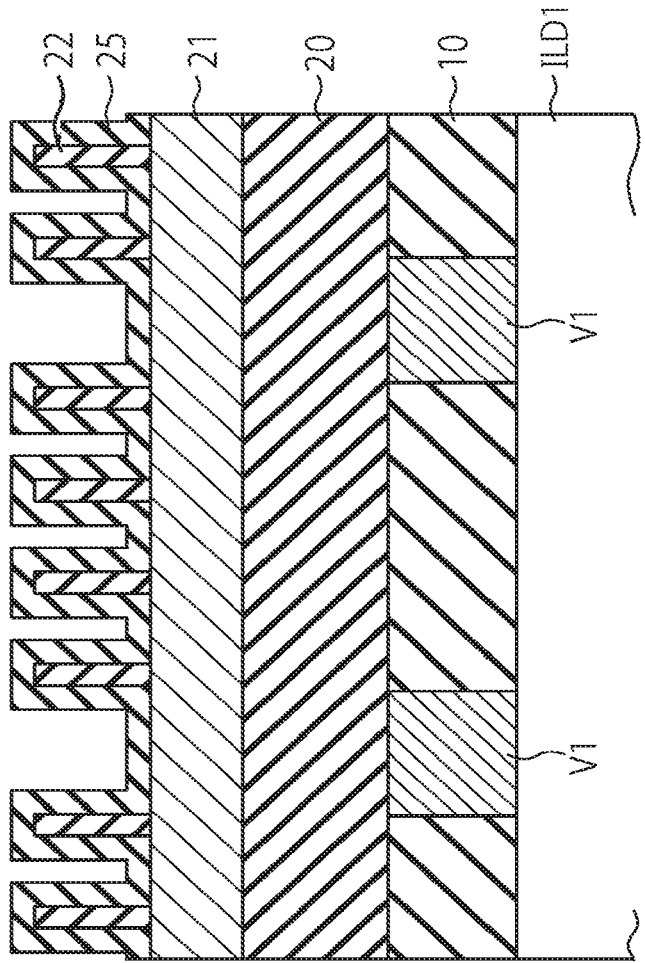
FIGS. 7A and 7B are sectional views showing the memory manufacturing method, following to FIGS. 6A and 6B, respectively.
Figure 7B:
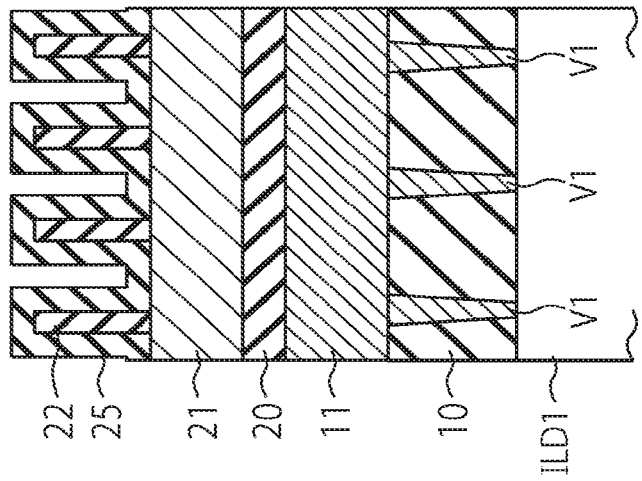

Subsequently, as shown in FIGS. 7A and 7B, using a CVD or ALD method, a side wall film 25 is formed on the side surface of the core material 22 and on the amorphous silicon layer 21. Used for the side wall film 25 is, for example, an insulation film such as a silicon oxide film.

Subsequently, using an RIE method or the like, the side wall film 25 is anisotropically etched back to remove the side wall film 25 from the upper surfaces of the core material 22 and of the amorphous silicon layer 21, while the side wall film 25 remaining on the side surface of the core material 22. In this way, the upper surfaces of the core material 22 and of the amorphous silicon layer 21 are exposed.

Subsequently, the core material 22 is selectively removed, having the side wall film 25 remaining. Accordingly, what is obtained is the configuration shown in FIGS. 8A and 8B. When the photoresist 24, the resist layer 22, etc. are processed with the minimum processed dimensions in the lithography method, the side wall film 25 is processed at ½ pitch of the minimum processed dimensions. In this way, a fine pattern smaller than the minimum processed dimensions can be formed using the side wall film 25 as a mask. The side wall film 25 may be used as a core material to form a further finer side-wall film mask (not shown).

Subsequently, as shown in FIGS. 9A and 9B, using the side wall film 25 as a mask, the amorphous silicon layer 21 is processed using an RIE method. In this way, the fine pattern of the side wall film 25 is transferred to the amorphous silicon layer 21. Accordingly, the amorphous silicon layer 21 as a mask material is formed over first metal film 11 and the insulation film 20. Since being used as a mask material, the amorphous silicon layer 21 is also referred to as a mask material 21, hereinafter.

Subsequently, using a lithography method, the region where the contact plugs 70 are to be formed in the peripheral circuit area Rp is covered with a photoresist (not shown). Subsequently, using the mask material 21 as a mask, the first metal film 11 and the silicon oxide film 20 are processed at the same time by an RIE method or the like. In this way, as shown in FIGS. 10A and 10B, the pattern of the mask material 21 is transferred to the first metal film 11 and the silicon oxide film 20. In this process, in the memory cell area Rc, the air gaps AG1 are formed in the first metal film 11 to form the bit lines BL. In the peripheral circuit area Rp, the air gaps AG2 are formed in the silicon oxide film 20 as the first insulation film. In this way, the air gaps AG1 and AG2 are formed in the same etching process. Since the first metal film 11 is processed into the bit lines BL, the first metal film 11 is also referred to as a bit line BL.

Since the air gaps AG1 and AG2 are formed using the side-wall transfer method, the width of the side wall film 25 is almost constant in the memory cell area Rc and the peripheral circuit area Rp. The width of each bit line BL in the direction (X-direction) in which the bit lines BL are adjacent to each other, which corresponds to the width of the side wall film 25 in the memory cell area Rc, is almost equal to the width of each first insulation film 20 in the direction (X-direction) in which the first insulation films 20 are adjacent to each other, which corresponds to the width of the side wall film 25 in the peripheral circuit area Rp.

When the width of the core material 22 is constant in the memory cell area Rc and the peripheral circuit area Rp, the width of each air gap AG1 in the X-direction in the memory cell area Rc is almost equal to the width of each air gap AG2 in the X-direction in the peripheral circuit area Rp.

The first metal film 11 is processed in the memory cell area Rc whereas the insulation film 20 is processed in the peripheral circuit area Rp. Since the insulation film 20 is etched at a higher etching rate than metals, the air gaps AG2 in the peripheral circuit area Rp are formed deeper than the air gaps AG1 in the memory cell area Rc.

Subsequently, as shown in FIGS. 11A and 11B, using a CVD method, a second insulation film 40 is formed on the bit lines BL, the air gaps AG1, and the air gaps AG2. The insulation film 40 is, for example, a silane film that is inferior to a TEOS film in coverage. For this reason, the insulation film 40 is formed to cover the air gaps AG1 and AG2 without being embedded therein. Since the air gaps AG1 and AG2 are covered with the insulation film 40 in the same process, the height of the upper surfaces of the air gaps AG2 is almost equal to the height of the upper surfaces of the air gaps AG1.

Subsequently, using a CVD method, an insulation film 50 is deposited on the silane film 40. Used for the insulation film 50 is, for example, a silicon nitride film.

Subsequently, using a CVD method, an insulation film 60 is deposited on the insulation film 50. Used for the insulation film 60 is, for example, a silicon oxide film.

Subsequently, using a CMP method, the insulation film 60 is flattened. When the insulation film 60 is flattened, since the insulation films 60 and 50 are formed to be relatively thick, cracks starting from the air gaps AG1 and AG2 rarely occur.

Subsequently, using a lithography method, a photoresist 65 is applied over the insulation film 60 and is then patterned to be a layout pattern of the contact plugs 70. What is obtained in this way is the configuration shown in FIGS. 11A and 11B.

Subsequently, as shown in FIGS. 12A and 12B, using the photoresist 65 as a mask, the insulation films 60, 50, 40, and 20 are etched using an RIE method. In this way, contact holes CH that reach the via contacts V1 are formed in the peripheral circuit area Rp.

Subsequently, by plating, the second metal films are embedded in the contact holes CH. Accordingly, the contact plugs 70 are formed in the insulation films 20 on both sides of each air gap AG2 in the peripheral circuit area Rp. As described above, the second wirings may be formed instead of the contact plugs 70. What is obtained in this way is the configuration almost the same as that shown in FIGS. 1A and 1B.

As described above, the memory according to the present embodiment has the following configuration. Each air gap AG1 is formed between the bit lines BL adjacent to each other in the memory cell area Rc, which restricts parasitic capacitance between the adjacent bit lines BL. Each air gap AG2 is formed in the insulation film 20 between the contact plugs 70 or the second wirings Wp adjacent to each other in the peripheral circuit area Rp, which restricts parasitic capacitance between the adjacent contact plugs 70 or second wirings Wp, even though thick insulation films 40, 50, and 60 are formed on the air gaps AG1. Therefore, according to the present embodiment, it is achieved to restrict the occurrence of cracks in the insulation films 40, 50, and 60, starting from the air gaps AG1 and to restrict the parasitic capacitance between the adjacent contact plugs 70 or second wirings Wp.

Furthermore, the air gaps AG1 and AG2 are formed in the same etching process using the same side wall mask. Moreover, the air gaps AG1 and AG2 are covered with the silane film 40 in the same deposition process. Therefore, the number of additional processes is relatively small in the present embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a plurality of first wirings provided in a first area and made of a first metal, a first gap being provided between the first wirings adjacent to each other;
    a plurality of second wirings or of contact plugs provided in a second area in which the first wirings are not provided, the second wirings or contact plugs made of a second metal;
    a first insulation film provided between the second wirings adjacent to each other or contact plugs adjacent to each other, the first insulation film comprising a plurality of second gaps;
    a second insulation film provided on the first wirings, the first gap, and the second gaps;
    a via provided below the second gaps; and
    one contact plug provided on the via, wherein
    a width of one of the first wirings in a direction in which the first wirings are adjacent to each other is almost equal to a width of the first insulation film between the second gaps,
    a width of the first gap in the direction in which the first wirings are adjacent to each other is almost equal to a width of one of the second gaps in a direction in which the second gaps are adjacent to each other,
    a depth of a bottom surface of one of the second gaps is deeper than a depth of a bottom surface of the first gap,
    a height of an upper surface of one of the second gaps is almost equal to a height of an upper surface of the first gap,
    the first and second gaps are extended in an extension direction of the first wirings,
    the first area is a memory cell area provided with a memory cell array,
    the second area is a peripheral circuit area provided around the memory cell area.

2. The semiconductor device according to claim 1, wherein the first metal is any one of tungsten, molybdenum, nickel, and cobalt.

3. The semiconductor device according to claim 1, wherein the second metal is any one of copper, silver, and gold.

* * * * *